US012648545B2

(12) United States Patent
    Olsson

(10) Patent No.:     US 12,648,545 B2
(45) Date of Patent:         Jun. 9, 2026

(54) ANIMAL EAR TAG

(71) Applicant: DELAVAL HOLDING AB, Tumba
    (SE)

(72) Inventor: Magnus Olsson, Tumba (SE)

(73) Assignee: DeLaval Holding AB, Tumba (SE)

( * ) Notice:   Subject to any disclaimer, the term of this
    patent is extended or adjusted under 35
    U.S.C. 154(b) by 172 days.

(21) Appl. No.:   18/567,714

(22) PCT Filed:   Jun. 22, 2022

(86) PCT No.:   PCT/SE2022/050622
    § 371 (c)(1),
    (2) Date:   Dec. 6, 2023

(87) PCT Pub. No.: WO2022/271075
    PCT Pub. Date: Dec. 29, 2022

(65)       Prior Publication Data
    US 2024/0206430 A1      Jun. 27, 2024

(30)       Foreign Application Priority Data
    Jun. 22, 2021    (SE) .................................... 2150804-9

(51) Int. Cl.
    *A01K 11/00*       (2006.01)
    *H05K 5/00*        (2006.01)
    *H05K 5/02*        (2006.01)
(52) U.S. Cl.
    CPC .......... *A01K 11/004* (2013.01); *H05K 5/0086*
        (2013.01); *H05K 5/0217* (2013.01)

(58) Field of Classification Search
    CPC ........................... A01K 13/003; A01K 11/001
    USPC ........................................................... 40/301
    See application file for complete search history.

(56)       References Cited

U.S. PATENT DOCUMENTS 4,854,328  A  *  8/1989  Pollack ................ A01K 11/004
                                                          128/903
    4,857,893  A     8/1989  Carroll
    5,461,807  A  *  10/1995  Johnson ............... A01K 11/006
                                                          40/300
                        (Continued)

FOREIGN PATENT DOCUMENTS

AT         517613  B1     3/2017
    CA        2796677  A1  *  5/2013  ........... A01K 11/004
                        (Continued)

OTHER PUBLICATIONS

International Search Report for PCT/SE2022/050622 mailed Sep.
27, 2022, 4 pages.
Written Opinion of the ISA for PCT/SE2022/050622 mailed Sep.
27, 2022, 5 pages.
Swedish Search Report for SE2150804-9 mailed Jan. 25, 2022, 3
pages.

*Primary Examiner* — Cassandra Davis
(74) *Attorney, Agent, or Firm* — NIXON &
VANDERHYE

(57)       ABSTRACT
The disclosure relates to an animal ear tag with a housing,
a battery, and an electronic circuit powered by the battery. A
coupling of the housing includes an opening configured to
receive a head portion of a male tag portion. The housing
may be formed in one piece and with a cavity in which the
battery and the electronic circuit are arranged in a potting.
The electronic circuit extends in a circuit plane and the
housing portion extends on both sides of the circuit plane.

21 Claims, 3 Drawing Sheets

(56)                     References Cited

U.S. PATENT DOCUMENTS

| | | | |
|---|---|---|---|
| 6,666,170 B1 * | 12/2003 | Hilpert | A01K 11/001 |
| | | | 119/814 |
| 10,856,523 B2 * | 12/2020 | Auer | A01K 11/004 |
| 2005/0145187 A1 * | 7/2005 | Gray | A01K 29/00 |
| | | | 119/174 |
| 2009/0094869 A1 | 4/2009 | Geissler et al. | |
| 2013/0092624 A1 * | 4/2013 | Bansal | B01D 46/521 |
| | | | 210/493.2 |
| 2018/0098521 A1 | 4/2018 | Auer | |
| 2018/0325382 A1 * | 11/2018 | Brandao | A01K 15/023 |
| 2020/0214256 A1 * | 7/2020 | Van Dijk | A01K 11/00 |
| 2020/0221666 A1 | 7/2020 | Tryding et al. | |
| 2020/0323170 A1 | 10/2020 | Garigan et al. | |
| 2022/0369593 A1 * | 11/2022 | Vogels | A01K 11/004 |

FOREIGN PATENT DOCUMENTS

| | | | | |
|---|---|---|---|---|
| CN | 112970616 A | 6/2021 | | |
| EP | 2191715 A1 | 6/2010 | | |
| EP | 2534945 A1 * | 12/2012 | | A01K 11/004 |
| EP | 3796774 A1 | 3/2021 | | |
| TW | M444710 U * | 1/2013 | | |
| WO | 9929167 A1 | 6/1999 | | |
| WO | WO-2015140486 A1 * | 9/2015 | | A01K 11/004 |
| WO | 2019053263 A1 | 3/2019 | | |
| WO | 2019218012 A1 | 11/2019 | | |
| WO | 2019226101 A1 | 11/2019 | | |

* cited by examiner

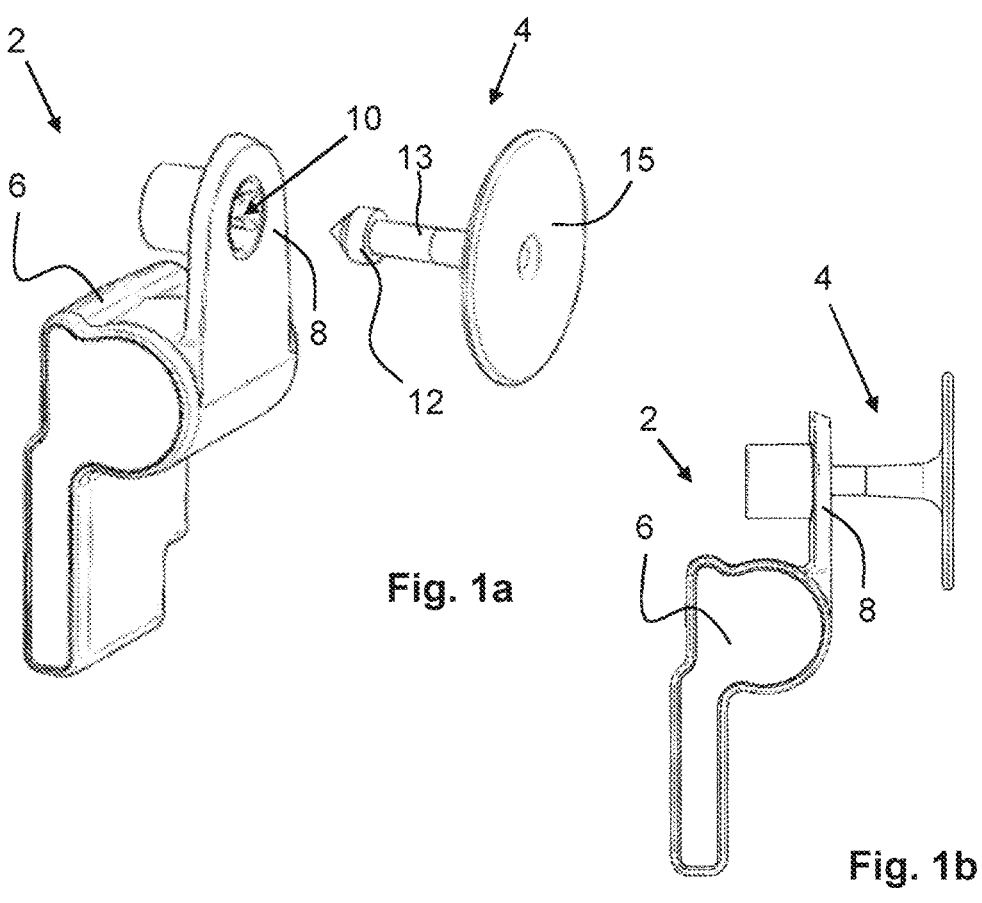
Fig. 1a
Fig. 1b
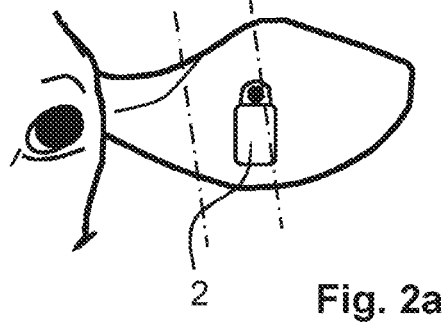
Fig. 2a
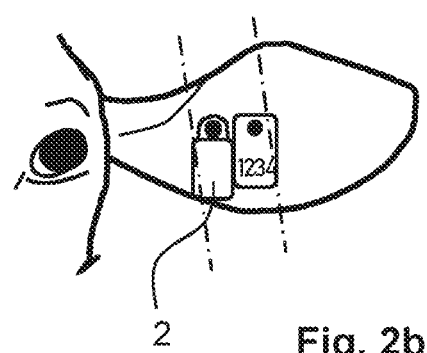
Fig. 2b

ANIMAL EAR TAG

CROSS-REFERENCE TO RELATED APPLICATIONS

This application is the U.S. national phase of International Application No. PCT/SE2022/050622 filed Jun. 22, 2022, which designated the U.S. and claims priority to SE 2150804-9 filed Jun. 22, 2021, the entire contents of each of which are hereby incorporated by reference.

TECHNICAL FIELD

The invention relates to an animal ear tag.

BACKGROUND

Individual domestic animals, such as livestock individuals, have to be identifiable. One way of identifying an animal individual is by means of an ear tag. The ear tag may display a unique number, by which the animal individual is identifiable.

One kind of ear tag is a so-called ISO tag, which includes a passive radio frequency transponder containing identity data of the relevant animal individual. The transponder is energized, and the identity data is read by means of a transceiver. ISO 11784 and ISO 11785 are international standards that regulate the radio-frequency identification (RFID) of animal individuals, e.g. provided by such ear tags.

WO 99/29167 discloses an animal ear tag including coupling means for installing the ear tag with an animal's ear. The coupling means has a stem with a head portion and a female opening through which the head portion can pass to effect a coupling action. The female opening being formed as part of a separate enclosed boss component of hard material which is fastened to material forming a further part of the ear tag.

A different kind of ear tag is used for registering animal data, such as data related to animal behaviour and/or animal health. Such an ear tag, in addition to electronic circuit elements, typically sensors, radio receivers, radio transmitters and data memories, also include a battery. Such an ear tag is an active electronic device and may be referred to as active animal ear tag. Registered and stored animal data in the ear tag is intermittently transmitted to a receiver and an animal management system.

U.S. Pat. No. 10,856,523 discloses an active animal ear tag. The animal ear tag is anchorable on an animal's ear by means of a dome and has a housing enclosing an electronics assembly and a battery, and a panel surface on which identification data relating to the animal are directly visible in legible characters. Specifically, the ear tag is configured for easy exchange of the battery. In one design, a housing which contains the electronics, can be detachably connected to the panel surface.

SUMMARY

An active animal ear tag i.e., an animal ear tag comprising a battery and a battery powered electronic circuit, may be used over long periods of time in a harsh environment. The ear tag is both subjected to rough handling as the ear tag wearing animal moves about in e.g., a barn interacting with other animals and barn interior including fencing and gates, and to extreme ambient conditions including moisture, temperature changes, and aggressive substances such as ammonia.

It has been realised that an easily accessible battery and electronic circuit of an active animal ear tag is in risk of being damaged in such harsh animal environments.

It would be advantageous to provide an animal ear tag overcoming, or at least alleviating the above-mentioned drawback. In particular, it would be desirable to provide an animal ear tag having a battery and an electronic circuit, which are protected. To better address one or more of these concerns, an animal ear tag having the features defined in the independent claim is provided.

According to an aspect of the invention, there is provided an animal ear tag comprising a housing, a battery, and an electronic circuit powered by the battery. A coupling portion of the housing is provided with an opening configured to receive therein a head portion of a male tag portion, the coupling portion being configured to engage with the head portion. The housing comprises a first housing portion formed in one piece and comprising a main portion of an outer surface of the housing. The first housing portion forms a cavity in which the battery and the electronic circuit are arranged. The electronic circuit extends in a circuit plane and the first housing portion extends on both sides of the circuit plane.

Since the first housing portion forms a cavity in which the battery and the electronic circuit are arranged and since the first housing portion extends on both sides of the circuit plane of the electronic circuit, the battery and the electronic circuit are protected by the first housing portion of the housing.

More specifically, the circuit plane of the electronic circuit forms a main plane of extension of the electronic circuit. Accordingly, the first housing portion extending on both sides of the circuit plane, means that the first housing portion extends over both main surfaces of the electronic circuit, thus protecting the electronic circuit.

The animal ear tag may be configured for being carried by an agricultural animal such as a cow, a sheep, or a goat. The agricultural animal may form part of a herd of livestock.

The animal ear tag it is an active animal ear tag since the electronic circuit is powered by the battery. The animal ear tag may comprise more than one battery. The animal ear tag may be configured for registering animal data, such as data related to animal behaviour and/or animal health. The electronic circuit may comprise one or more of integrated circuits, discrete components, sensors, radio receivers, radio transmitters and data memories. The animal ear tag is configured for transmitting registered and stored animal data to a receiver. Such transmitting may be performed intermittently.

The animal ear tag is configured for being attached to an ear of an animal. When so, the above-mentioned male tag portion protrudes through the ear of the animal. The engagement between the head portion of the male tag and the coupling portion ensures that the animal ear tag remains attached to the ear of the animal. The ear of the animal is caught between the animal ear tag and an enlarged portion of the male tag portion.

The coupling portion of the housing may be a portion of the housing specifically configured for coupling to the male tag portion. For this purpose, the coupling portion is provided with an opening. The coupling portion with the opening forms a female tag portion. The opening may be a through opening accessible from both sides of the animal ear tag or a blind opening accessible from only one side of the animal ear tag.

The first housing portion being formed in one piece entails that the body of material forming the first housing portion is seamless. The first housing portion comprising the main portion of an outer surface of the housing may mean that the first housing portion forms the largest individual part of the housing. Also, the first housing portion comprising the main portion of an outer surface of the housing means that the first housing portion forms an outermost layer of the housing in portions of the housing where it has more than one layer. Additionally, the first housing portion may form portions of the housing having only one layer, which accordingly will comprise a portion of the outer surface of the housing.

The battery and the electronic circuit are housed in the cavity. Inside the cavity, the first housing portion may be configured to enclose the battery and the electronic circuit on at least four sides out of the total six sides seen in a three-dimensional Cartesian coordinate system. The first housing portion may be configured to enclose the battery and the electronic circuit on five sides seen in the three-dimensional Cartesian coordinate system, i.e. leaving only one side of the cavity in the first housing portion open for insertion of the battery and the electronic circuit thereinto. Two of the four of five sides extend on each side of the circuit plane.

According to embodiments, the battery and the electronic circuit may be potted in the cavity in a potting material. In this manner, it may be ensured that the battery and the electronic circuit are protected from moisture and harmful chemical substances such as e.g., ammonia.

More specifically, the battery may have a service life of at least one year, such as at least 2 years, such as at least 5 years. Accordingly, provided with such a battery, the animal ear tag may be operable over a relevant portion of the life span of most agricultural animal individuals. The relevant portion of the life span is a portion, during which it may be of interest to collect animal data. The animal ear tag may even be moved from a first animal individual to a different animal individual after its functionality in connection with the first animal individual is no longer required.

Thus, it has been realised that the animal ear tag may be powered by the same battery or batteries over its entire operable period and that the animal ear tag may be in a condition ready to be discarded, when the battery or batteries runs out of power. Therefore, since battery change may not be required, protecting the battery and the electronic circuit by means of potting them in the cavity may be a viable option.

According to embodiments, the first housing portion may be provided with an aperture adjoining the cavity, and the potting material may fill the whole cavity around the battery and the electronic circuit and the aperture. In this manner, the entire cavity and the aperture may be filled with potting material and thus, may prevent moisture and harmful substances from entering the cavity and preventing them from affecting the battery and the electronic circuit.

According to embodiments, the first housing portion may comprise a protruding member, and the protruding member may comprise the coupling portion. In this manner, the coupling portion may be provided on the housing in such a way that the coupling portion may be easily accessible for the male tag portion to engage therewith.

According to embodiments, the animal ear tag may comprise a socket member, wherein the socket member may comprise the coupling portion, and wherein the socket member may be at least partially embedded in the protruding member. In this manner, the coupling portion may be provided by a socket member arranged in the protruding member of the first housing portion. Thus, different properties may be accorded to the socket member and the protruding member. For instance, the socket member may be made from a different material than the protruding member and the first housing portion. Accordingly, the material of the socket member may be selected for its properties related to durable engagement with the male tag portion. The material of the first housing portion and the protruding member may be selected for other properties, such as moisture resistance and/or resistance to material fatigue and/or impact damping characteristics.

According to embodiments, the battery may have a generally cylindrical or prism shape and extends along a battery axis, the battery axis extending substantially in parallel with the circuit plane. The battery may be arranged in a battery portion of the housing and the electronic circuit may be arranged at least partially in an electronic circuit portion of the housing. The electronic circuit portion may extend tangentially from the battery portion in a first direction, and the protruding member may extend tangentially from the battery portion in a second direction in parallel with and opposite to the first direction from a diametrically opposite side of the battery portion to the electronic circuit portion. In this manner, the housing may have a step-like or stair-like shape. Accordingly, when mounted in an animal ear, a major portion of the protruding member may abut against the ear while the electronic circuit portion of the housing may be arranged at a distance from the ear due to it being arranged on an opposite side of the battery portion to the protruding member. Therefore, the electronic circuit portion of the housing will not abut against the ear or only abut against the ear sporadically and/or with a minor surface portion. Thus, only part of the housing may abut against the ear of the animal, which promotes ventilation of the area between the animal ear and the animal ear tag and accordingly, reduces the risk for skin condition and/or skin disorder in the animal ear.

The battery portion, the electronic circuit portion, and the protruding member may form part of the first housing portion.

Further features of, and advantages with, the invention will become apparent when studying the appended claims and the following detailed description.

BRIEF DESCRIPTION OF THE DRAWINGS

Various aspects and/or embodiments of the invention, including its particular features and advantages, will be readily understood from the example embodiments discussed in the following detailed description and the accompanying drawings, in which:

FIGS. 1a and 1b illustrate two views of an animal ear tag according to embodiments, FIGS. 2a and 2b illustrate two ways of attaching and animal ear tag to an ear of an animal.

DETAILED DESCRIPTION

Figure 3:
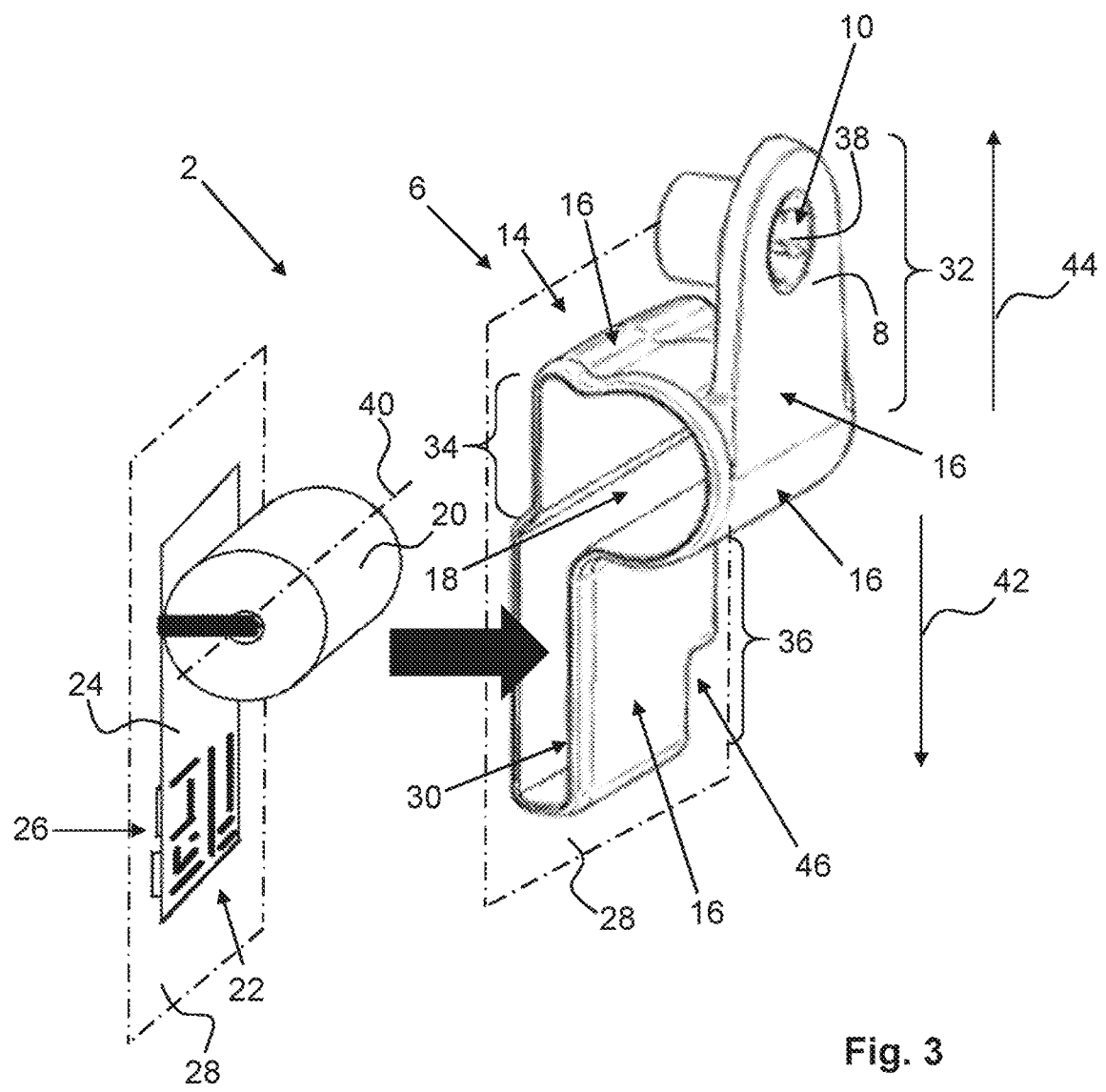
FIG. 3 illustrates an exploded view of an animal ear tag according to embodiments.

Aspects and/or embodiments of the invention will now be described more fully. Like numbers refer to like elements throughout. Well-known functions or constructions will not necessarily be described in detail for brevity and/or clarity.

FIGS. 1a and 1b illustrate two views of an animal ear tag 2 according to embodiments.

The animal ear tag 2 is an active animal ear tag i.e., comprising a battery powered electronic circuit. The animal ear tag 2 is configured to be attached to an ear of an animal with the aid of a male tag portion 4.

The animal ear tag 2 comprises a housing 6. The housing 6 includes a coupling portion 8 which is provided with an opening 10 configured to receive therein a head portion 12 of the male tag portion 4. In FIG. 1a, the male tag portion 4 is shown separate from the animal ear tag 2. In FIG. 1b, part of the male tag portion 4 is shown in a position inserted into the opening 10, in the same manner as when the animal ear tag 2 is attached to an ear of an animal. In this position of the male tag portion 4, the coupling portion 8 of the ear tag engages with the head portion 12 of the male tag portion 4.

A stem portion 13 of the male tag portion 4 connects to the head portion 12 and to a broad disc-shaped member 15. The stem portion 13 is configured to extend through the ear of the animal and the disc-shaped member 15 is configured to prevent the male tag portion 4 from slipping through the ear of the animal. The housing 6 of the animal ear tag 2 is also of a size which prevents it from slipping through the animal ear. Accordingly, the animal ear tag 2 may be secured to the ear of an animal when the coupling portion 8 of the ear tag engages with the head portion 12 of the male tag portion 4.

FIGS. 2a and 2b illustrate two ways of attaching an animal ear tag 2 to an ear of an animal. The animal ear tag 2 is an animal ear tag 2 as discussed above with reference to FIGS. 1a and 1b.

In FIG. 2a the ear of the animal carries only the animal ear tag 2. If the animal also carries an RFID/ISO ear tag, it is not carried in the same ear as the active animal ear tag 2. That is, an RFID/ISO ear tag is carried in an opposite ear to that carrying the active animal ear tag 2. Suitably, the animal ear tag 2 is attached to the ear between a half and a quarter of the ear's length as indicated by the dash-dotted lines. The animal ear tag 2 should be attached where there is no blood vessel.

In FIG. 2b the active animal ear tag 2 is attached to the same ear as an ear tag provided with an animal number. The ear tag provided with the animal number may not contain any active or passive electronic circuit. Suitably, the active animal ear tag 2 is attached to the ear closer to the animal head than the ear tag provided with the animal number. Again, the animal ear tag 2 is attached to the ear between a half and a quarter of the ear's length and the animal ear tag 2 should be attached where there is no blood vessel.

FIG. 3 illustrates an exploded view of an animal ear tag 2 according to embodiments. The animal ear tag 2 may be an animal ear tag as discussed above with reference to FIGS. 1a-2b.

The animal ear tag 2 comprises a housing 6. The housing 6 comprises a first housing portion 14 formed in one piece. The first housing portion 14 comprises a main portion of an outer surface 16 of the housing 6. The first housing portion 14 forms a cavity 18.

The first housing portion 14 forms an outermost layer of the housing 6 in portions where the housing 6 has more than one layer, such as e.g. around the cavity 18. The first housing portion 14 also form portions of the housing 6 having one layer only.

The animal ear tag 2 further comprises a battery 20 and an electronic circuit 22 powered by the battery 20. The battery 20 and the electronic circuit 22 are arranged in the cavity 18, as indicated by the broad arrow in FIG. 3.

The electronic circuit 22 may comprise a printed circuit board 24 and thereon attached discrete electronic components, and/or integrated circuits, and one or more of sensors, radio receivers, radio transmitters, and data memories, all indicated with reference number 26 in FIG. 3. Also, the battery 20 may be attached to the printed circuit board 24. Thus, the animal ear tag 2 may serve for monitoring of states and types of behaviour of the animal carrying the animal ear tag 2 and for this purpose may carry out measurements and data processing using the electronic circuit 22 and communicate measurements and/or data by radio with further devices.

According to alternative embodiments, the electronic circuit 22 may be one dedicated integrated circuit alone including all functionality of the animal ear tag 2 for carrying out measurements and data processing, such as e.g. an ASIC or a FPGA.

Irrespective of whether the electronic circuit 22 comprises a printed circuit board 24 or only one dedicated integrated circuit, the electronic circuit 22 extends in a circuit plane 28. The circuit plane 28 extends in a main extension of the electronic circuit 22. Accordingly, in the illustrated embodiments, the circuit plane 28 extends in a plane of the printed circuit board 24. When arranged in the cavity 18 of the first housing portion 14, the first housing portion 14 extends on both sides of the circuit plane 28.

In FIG. 3, the circuit plane at 28 is shown twice, once at the electronic circuit 22 and once at the housing 6 and the first housing portion 14. In FIG. 3, the electronic circuit 22 is presented at a different angle than the housing 6 in order to show the components and the circuits 26 attached to the printed circuit board 24. Accordingly, in order to position the electronic circuit 22 inside the cavity 18, the electronic circuit 22 is aligned with the extension of the cavity 18 and the circuit plane 28 indicated at the housing 6.

Arranged in the cavity 18 with the first housing portion 14 extending on both sides of the circuit plane 28 and accordingly, on both major sides of the electronic circuit 22, the electronic circuit 22 as well as the battery 20 are arranged in a protected manner in the housing 6.

The first housing portion 14 may be formed from a thermoplastic elastomer, such as thermoplastic polyurethane. In this manner, the first housing portion 14 may comprise elastic properties and thus, may provide an impact damping property of the animal ear tag 2. Accordingly, if the animal ear tag 2 is subjected to blows or is bumping into hard objects, the first housing portion 14 may reduce the effect such impact may have on the electronic circuit 22 and the battery 20.

The first housing portion 14 may be manufactured by injection moulding.

The first housing portion 14 is provided with an aperture 30 adjoining the cavity 18. That is, the aperture 30 forms the opening by means of which the inside of the cavity 18 is accessible for inserting the battery 20 and the electronic circuit 22 into the cavity 18. Accordingly, when the battery 20 and the electronic circuit 22 is positioned in the cavity 18, the first housing portion 14 encloses the battery 20 and the electronic circuit 22 on five out of six sides seen in a three-dimensional Cartesian coordinate system. The aperture 30 is the sixth open side in the three-dimensional Cartesian coordinate system.

The battery 20 and the electronic circuit 22 are potted in the cavity 18 in a potting material. That is, during manufacturing of the animal ear tag 2, after the battery 20 and the electronic circuit 22 have been inserted into the cavity 18, the potting material is injected into the cavity 18 to enclose the battery 20 and the electronic circuit 22. In this manner, the battery 20 and the electronic circuit 22 are potted in the cavity 18 in the potting material.

The potting material fills the whole cavity around the battery 20 and the electronic circuit 22. The potting material also fills up the aperture 30. Thus, the potting material forms part of the outer surface of the animal ear tag 2, see FIGS. 1*a* and 1*b*. Also, the potting material forms part of the housing 6.

The potting material may comprise a thermosetting polyurethane. In this manner, a moisture tight enclosing of the battery 20 and electronic circuit 22 may be achieved.

As mentioned above, the housing 6 comprises the coupling portion 8 provided with the opening 10. More specifically, the first housing portion 14 comprises the coupling portion 8. The coupling portion 8 forms a female tag portion configured to engage with the male tag portion. Further, the first housing portion 14 comprises a protruding member 32, a battery portion 34, and an electronic circuit portion 36. The protruding member 32 comprises the coupling portion 8.

The coupling portion 8 may comprise at least one resilient member 38 extending into the opening 10. The at least one resilient member 38 is configured for engagement with the head portion of the male tag portion.

The opening 10 may be a through opening accessible from both sides of the animal ear tag 2. In this case, the animal ear tag 2 may be reused by cutting the stem 13 of the male tag portion 4 and removing the head portion 12 from the coupling portion 8 of the animal ear tag 2, see FIGS. 1*a* and 1*b*. Thus, the animal ear tag 2 may be reused utilising a new male tag portion. Alternatively, the opening 10 may be a blind opening accessible from only one side of the animal ear tag. In this case, the head portion 12 of the male tag portion 4 cannot to be removed from the animal ear tag 2 without rupturing the housing 6. Thus, an animal ear tag 2 which has been used on an animal cannot be reused, at least not without damaging the housing 6. Tampering with the animal ear tag 2 may thus, be revealed.

The protruding member 32 and the coupling portion 8 may be formed in one piece with the first housing portion 14. In this manner, the female tag portion forms an integrated part of the first housing portion 14. Accordingly, the entire first housing portion 14 may be manufactured from one material.

Alternatively, as discussed below with reference to FIGS. 4*a*-5*d*, the animal ear tag 2 may comprise a socket member. The socket member comprises the coupling portion 8 and is formed as a separate part, which is at least partially embedded in the protruding member 32.

The housing 6 as a step-like or stair-like shape, with the electronic circuit portion 36 being offset from the protruding member 32. The protruding member 32 and the electronic circuit portion 36 are connected to diametrically opposite sides of the battery portion 34. Since the protruding member 32 comprises the coupling portion 8, it will be positioned closest to the ear of an animal when it is attached thereto. The protruding member 32 will thus, be that part of the animal ear tag 2 which mainly contacts the animal ear. Since the electronic circuit portion 36 is offset from the protruding member 32, it will contact the animal ear to a much lesser extent. Thus, only part of the housing 6 will abut against the ear of the animal, which promotes ventilation of the area between the animal ear and the animal ear tag. Skin health in the ear of the animal may thus be promoted.

More specifically, the battery 20 has a generally cylindrical or prism shape and extends along a battery axis 40. The battery axis 40 extends substantially in parallel with the circuit plane 28. Thus, the battery 20 is aligned with the circuit plane 28 to fit easily into the cavity 18. The battery 20 is arranged in the battery portion 34 of the housing 6 and the electronic circuit 22 is arranged at least partially in the electronic circuit portion 36 of the housing 8. Part of the electronic circuit 22 may be arranged in the battery portion 34. The electronic circuit portion 36 extends tangentially from the battery portion 34 in a first direction 42. The protruding member 32 extends tangentially from the battery portion 34 in a second direction 44 in parallel with and opposite to the first direction 42 from a side of the battery portion 34 diametrically opposite to the electronic circuit portion 36.

The electronic circuit portion 36 of the housing 6 comprises a recess 46 at an end portion thereof opposite to the battery portion 34 of the housing 6. In this manner, the shape of the housing 6 may be adapted to that of the electronic circuit 22. Namely, the electronic circuit 22 may not have an entirely square or regular shape. By providing the electronic circuit portion 36 with one or more recesses 46, material of the housing may be saved by adapting the electronic circuit portion 36 at least partially to that of the electronic circuit 22. Thus, also weight of the animal ear tag 2 may be saved by not filling out the housing 6 to a more even shape, such as square, around recesses of the electronic circuit 22.

Figures 4A, 4B, 5A, 5B, 5C, 5D:
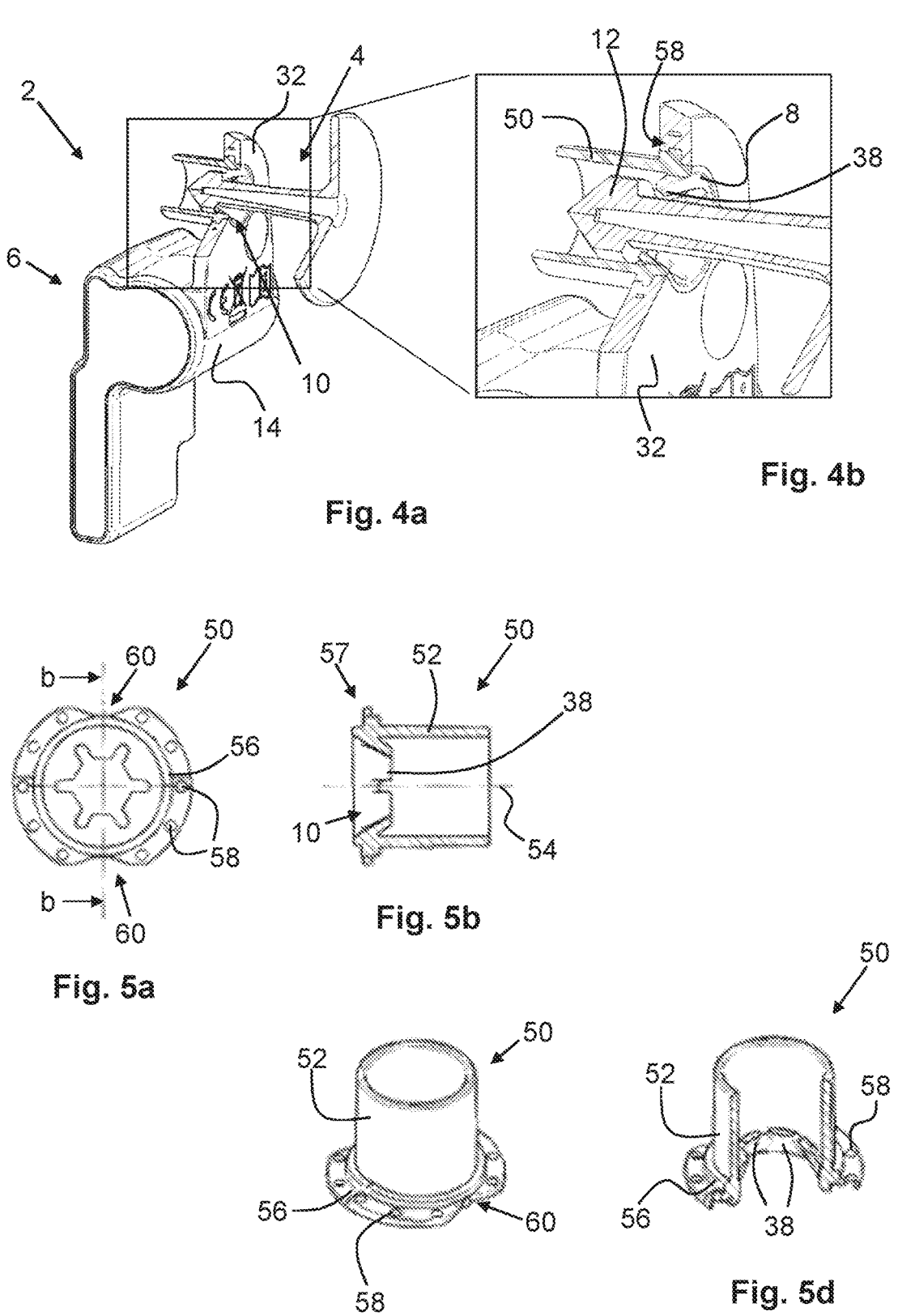
FIGS. 4a and 4b illustrate an animal ear tag according to embodiments.
FIGS. 5a-5d illustrate a socket member.

FIGS. 4*a* and 4*b* illustrate an animal ear tag 2 according to embodiments. FIG. 4*b* shows a partial cross section through the animal ear tag 2 of FIG. 4*a*. The animal ear tag 2 resembles in much the animal ear tag 2 discussed above with reference to FIGS. 1*a*-3. Accordingly, in the following, mainly the features differentiating the embodiments will be discussed.

FIGS. 5*a*-5*d* illustrate a socket member 50 of the animal ear tag 2 of FIGS. 4*a* and 4*b* and show various views and cross sections of the socket member 50. In the following, reference is made to FIGS. 4*a*-5*d*.

Again, the animal ear tag 2 comprises a housing 6. In a cavity of a first housing portion 14 of the housing 6 there are arranged a battery and an electronic circuit powered by the battery. The first housing portion 14 comprises a protruding member 32. A coupling portion 8 is arranged at the protruding member 32 and is provided with an opening 10 configured to receive therein a head portion 12 of a male tag portion 4.

The animal ear tag 2 comprises a socket member 50. The socket member 50 comprises the coupling portion 8. The socket member 50 is at least partially embedded in the protruding member 32. As discussed above, the coupling portion 8 is a portion of the housing 6 specifically configured for coupling to the male tag portion 4. The socket member 50 may comprise further parts than the coupling portion 8, e.g. to ensure a secure embedding of the socket member 50 in the protruding member 32.

The socket member 50 may be formed from a polyamide, or from a different suitable material selected for its property to provide a secure engagement with the male tag portion 4.

The first housing portion 14 and the socket member 50 may be a result of a two material injection moulding process. In this manner, the socket member 50 may be embedded in a convenient manner in the first housing portion 14.

Briefly, the two material injection moulding process may be a so-called multi-shot process wherein in a first injection step the socket member 50 is moulded and in a second injection step the first housing portion 14 is moulded, both steps being performed in the same mould. Alternatively, the two material injection moulding process may be a so-called over-moulding process wherein the socket member 50 is pre-manufactured and inserted into a mould, in which the first housing portion 14 is moulded over the socket member 50.

The socket member 50 comprises a cylindrical portion 52 having a centre axis 54. The opening 10 is a through opening. The through opening 10 extends through the cylindrical portion 52. The socket member 50 comprises an outer flange 56 extending substantially perpendicularly to the centre axis 54 and is arranged towards one end portion 57 of the cylindrical portion 52. The outer flange 56 is embedded in the protruding member 32. In this manner, the outer flange 56 ensures that the socket member 50 is securely embedded in the protruding member 32 and the first housing portion 14.

Also, since the opening 10 is a through opening, when the male tag portion 4 connected to the animal ear tag 2 is cut, the head portion 12 thereof can be removed from the ear tag 2. As a result, the animal ear tag 2 is removable from one animal individual and reusable with a new male tag portion 4 on a different animal individual.

The term outer flange 56 relates to a flange arranged at an outside of the cylindrical portion 52 of the socket member 50.

The socket member 50 comprises at least one resilient member 38 extending into the opening 10. The at least one resilient member 38 is configured for engagement with the head portion 12 of the male tag portion 4. In this manner, the male tag portion 4 may be secured to the socket member 50 and accordingly, to the animal ear tag 2. Due to springy properties of the at least one resilient member 38, the at least one resilient member 38 gives away to the head portion 12 of the male tag portion 4 as it is introduced into the opening 10. Once the head portion 12 is positioned inside the cylindrical portion 52 of the socket member 50, the at least one resilient member 38 springs back to its original position and locks the male tag portion 4 to the animal ear tag 2.

The at least one resilient member 38 may comprise a number of lip members extending from the cylindrical portion 52 inwardly towards the centre axis 54, as shown in the illustrated embodiments.

According to some embodiments, the outer flange 56 may be provided with through holes 58. In this manner, during manufacturing of the animal ear tag 2, the material of the first housing portion 14 may penetrate into the through holes 58, see FIG. 4b. Thus, the socket member 50 may be securely embedded in the protruding member 32 and the first housing portion 14.

According to some embodiments, the outer flange 56 may have a noncircular outer perimeter. In this manner, since the outer flange 56 is embedded in the protruding member 32, the rotation of the socket member 50 in the protruding member 32 may be prevented. More specifically, the material of the first housing portion 14 at the protruding member 32 embeds the noncircular outer perimeter of the outer flange 56. Thus, the socket member 50 is secure in a specific rotational position about the centre axis 54 in the protruding member 32.

In the embodiments illustrated in FIGS. 5a-5d, the noncircular outer perimeter of the outer flange 56 is achieved by two recesses 60 in the outer flange 56.

It is to be understood that the foregoing is illustrative of various example embodiments and that the invention is defined only by the appended claims. A person skilled in the art will realize that the example embodiments may be modified, and that different features of the example embodiments may be combined to create embodiments other than those described herein, without departing from the scope of the invention, as defined by the appended claims.

The invention claimed is:

1. An animal ear tag comprising:
a housing comprising a first material,
a battery, and
an electronic circuit powered by the battery,
wherein the housing comprises an opening configured to receive therein a head portion of a male tag portion, the opening configured to engage with the head portion,
wherein the housing comprises a first housing portion formed in one piece and comprising a main portion of an outer surface of the housing,
wherein the first housing portion forms a cavity in which the battery and the electronic circuit are arranged,
wherein the battery and the electronic circuit are potted in the cavity in a potting material comprising a second material that fills an entirety of the cavity around the battery and the electronic circuit, the second material being different than the first material of the housing,
wherein the electronic circuit extends in a circuit plane, and
wherein the first housing portion extends over both main surfaces of the circuit plane.

2. The animal ear tag according to claim 1, wherein the first housing portion is formed from a thermoplastic elastomer.

3. The animal ear tag according to claim 2, wherein the thermoplastic elastomer is a thermoplastic polyurethane.

4. The animal ear tag according to claim 1, wherein the cavity encloses the battery and the electronic circuit on five sides with only one side of the cavity open for insertion of the battery and the electronic circuit thereinto.

5. The animal ear tag according to claim 1, wherein the potting material comprises a thermosetting polyurethane.

6. The animal ear tag according to claim 1, wherein the first housing portion is provided with an aperture adjoining the cavity, and wherein the potting material fills the entirety of the cavity around the battery and the electronic circuit and the aperture.

7. The animal ear tag according to claim 1, wherein the first housing portion comprises a protruding member, and wherein the protruding member comprises the opening.

8. The animal ear tag according to claim 7, wherein the protruding member and the opening are formed in one piece with the first housing portion.

9. The animal ear tag according to claim 7, comprising a socket, wherein the socket comprises the opening, and wherein the socket is at least partially embedded in the protruding member.

10. The animal ear tag according to claim 9, wherein the first housing portion and the socket are a result of a two-material injection moulding process.

11. The animal ear tag according to claim 9, wherein the socket is formed from a polyamide.

12. The animal ear tag according to claim 9, wherein the socket comprises at least one lip extending into the opening, and wherein the at least one lip is configured for engagement with the head portion of the male tag portion.

13. The animal ear tag of claim 1 wherein the cavity encloses the battery and the electronic circuit on five sides with only one side of the cavity open for insertion of the battery and the electronic circuit thereinto,
wherein the first housing portion is provided with an aperture adjoining the cavity the potting material fills the entirety of the cavity around the battery and the electronic circuit and the aperture, and wherein the potting material comprises a thermosetting polyurethane.

14. An animal ear tag comprising:
a housing,
a battery, and
an electronic circuit powered by the battery,
wherein the housing comprises an opening configured to receive therein a head portion of a male tag portion, the opening configured to engage with the head portion,
wherein the housing comprises a first housing portion formed in one piece and comprising a main portion of an outer surface of the housing,
wherein the first housing portion forms a cavity in which the battery and the electronic circuit are arranged,
wherein the electronic circuit extends in a circuit plane,
wherein the first housing portion extends over both main surfaces of the circuit plane,
wherein the first housing portion comprises a protruding member, and wherein the protruding member comprises the opening,
wherein the protruding member and the opening are formed in one piece with the first housing portion,
wherein the animal ear tag comprises a socket, wherein the socket comprises the opening, and wherein the socket is at least partially embedded in the protruding member,
wherein the socket comprises a cylindrical portion having a centre axis,
wherein the opening is a through opening,
wherein the through opening extends through the cylindrical portion,
wherein the socket comprises an outer flange extending substantially perpendicularly to the centre axis and is arranged towards one end portion of the cylindrical portion, and
wherein the outer flange is embedded in the protruding member.

15. The animal ear tag according to claim 14, wherein the outer flange is provided with through holes.

16. The animal ear tag according to claim 14, wherein the outer flange has a noncircular outer perimeter.

17. An animal ear tag comprising:
a housing,
a battery, and
an electronic circuit powered by the battery,
wherein the housing comprises an opening configured to receive therein a head portion of a male tag portion, the opening configured to engage with the head portion,
wherein the housing comprises a first housing portion formed in one piece and comprising a main portion of an outer surface of the housing,
wherein the first housing portion forms a cavity in which the battery and the electronic circuit are arranged,
wherein the electronic circuit extends in a circuit plane,
wherein the first housing portion extends over both main surfaces of the circuit plane, wherein the battery has a generally cylindrical or prism shape and extends along a battery axis, the battery axis extending substantially in parallel with the circuit plane,
wherein the battery is arranged in a battery portion of the housing and the electronic circuit is arranged at least partially in an electronic circuit portion of the housing,
wherein the electronic circuit portion extends tangentially from the battery portion in a first direction,
wherein the first housing portion comprises a protruding member, and wherein the protruding member comprises the opening, and
wherein the protruding member extends tangentially from the battery portion in a second direction in parallel with and opposite to the first direction from a diametrically opposite side of the battery portion to the electronic circuit portion.

18. The animal ear tag according to claim 17, wherein the electronic circuit portion of the housing comprises a recess at an end portion thereof opposite to the battery portion of the housing.

19. An animal ear tag comprising:
a housing,
a battery, and
an electronic circuit powered by the battery,
wherein the housing comprises an opening configured to receive therein a head portion of a male tag portion, the opening configured to engage with the head portion,
wherein the housing comprises a first housing portion formed in one piece and comprising a main portion of an outer surface of the housing,
wherein the first housing portion forms a cavity in which the battery and the electronic circuit are arranged,
wherein the battery and the electronic circuit are potted in the cavity in a potting material that fills an entirety of the cavity around the battery and the electronic circuit,
wherein the electronic circuit extends in a circuit plane,
wherein the first housing portion extends over both main surfaces of the circuit plane,
wherein the cavity encloses the battery and the electronic circuit on five sides with only one side of the cavity open for insertion of the battery and the electronic circuit thereinto, and
wherein the first housing portion is provided with an aperture adjoining the cavity, and wherein the potting material fills the entirety of the cavity around the battery and the electronic circuit and the aperture.

20. The animal ear tag of claim 19, wherein the housing comprises a first material, and
wherein the potting material comprises a second material that is different from the first material.

21. The animal tag of claim 20, wherein the first material is a thermoplastic polyurethane and the second material is a thermosetting polyurethane.

* * * * *